United States Patent [19]

Letourneau

[11] Patent Number: 5,027,063
[45] Date of Patent: Jun. 25, 1991

[54] VACUUM-ACTUATED TEST FIXTURE FOR TESTING ELECTRONIC COMPONENTS

[75] Inventor: Andre P. Letourneau, Everett, Wash.

[73] Assignee: John Fluke Mfg. Co., Inc., Everett, Wash.

[21] Appl. No.: 513,561

[22] Filed: Apr. 24, 1990

[51] Int. Cl.⁵ .............................................. G01R 31/00
[52] U.S. Cl. ................................ 324/158 F; 324/158 P
[58] Field of Search ............... 324/158 F, 158 P, 72.5, 324/537, 158 R, 73.1, 500; 439/482, 824

[56] References Cited

U.S. PATENT DOCUMENTS

| | | | |
|---|---|---|---|
| 4,115,735 | 9/1978 | Stanford | 324/158 F |
| 4,160,207 | 7/1979 | Haines | 324/158 F |
| 4,322,682 | 3/1982 | Schadwill | 324/158 F |
| 4,357,062 | 11/1982 | Everett | 339/18 R |
| 4,536,051 | 8/1985 | Smith et al. | 324/158 F |
| 4,538,104 | 8/1985 | Douglas et al. | 324/158 F |
| 4,626,776 | 12/1986 | Wilkinson | 324/73 PC |
| 4,746,861 | 5/1988 | Nesbitt | 324/158 F |
| 4,771,234 | 9/1988 | Cook et al. | 324/158 F |
| 4,841,231 | 6/1989 | Angelucci | 324/73 R |

Primary Examiner—Kenneth A. Wieder
Assistant Examiner—Vinh P. Nguyen
Attorney, Agent, or Firm—George T. Noe

[57] ABSTRACT

A miniature vacuum-actuated test fixture for testing individual components or localized areas of circuit boards includes a probe module having an array of probes carried by a piston, and a separable registration module which may be visually aligned over a component or circuitry and attached before the probes are ever in contact with the circuit board. Once the registration module is attached to the circuit board, the registration module is joined with the probe module, and the probe module is evacuated, drawing the piston upward, carrying the probes into contact with the component or circuitry.

13 Claims, 4 Drawing Sheets

VACUUM-ACTUATED TEST FIXTURE FOR TESTING ELECTRONIC COMPONENTS

BACKGROUND OF THE INVENTION

This invention relates generally to vacuum-actuated test fixtures, and in particular, to a vacuum-actuated test fixture for testing individual electronic components.

There are numerous methods and test fixtures for testing the functionality of printed circuit boards and components on such boards, ranging from "bed of nails" testers to devices which clip on over a component such as an integrated circuit. However, conventional methods become more difficult to apply as boards and components thereon become physically smaller. Particularly, with the advent of surface-mounted integrated circuits and other miniaturized packages, such as microprocessors, programmable logic arrays, and other pin grid array packages, clip-on fixtures become difficult, if not impossible, to use because signal pins or component leads are not accessible on the component side of the board.

There have been various types of mechanical arrangements for clamping or holding down circuit boards proposed; however, early investigators in the art determined that the use of vacuum-actuated test fixtures provided an effective method of holding a circuit board while probing circuit nodes on the underside. Such conventional vacuum-actuated test fixtures typically pulled the circuit board assembly down onto the test pins, or probes, causing non-uniformly distributed point loads which result in undue stress, board warpage, and often damage to the circuit board.

Another problem associated with prior art vacuum-actuated test fixtures is alignment of the board with the test probes. Some test fixtures use a double-plate approach in which a set of test probes arranged in a predetermined pattern are placed into a lower plate, while the upper plate is provided with so-called tooling pins to mate with holes in the circuit board assembly to permit registration of circuit test nodes with probes. Another solution to the alignment problem is the use of a so-called universal test fixture in which the bottom plate includes a matrix of test probes, and the top plate is drilled in a predetermined pattern to mask off the unwanted probes while allowing the desired probe pins to pass therethrough to the circuit test nodes of the circuit board assembly. These fixturing techniques are expensive to implement and maintain, and require custom test heads or plates for each circuit board assembly.

SUMMARY OF THE INVENTION

In accordance with the present invention, a miniature vacuum-actuated test fixture for testing components or localized areas of circuitry on a circuit board comprises a registration module and a probe module which are separable. The registration module may be visually aligned over a component or circuitry, and held in place by use of vacuum before the probe pins are ever in contact with the board. Extremely compliant seals allow the registration module to be attached to a circuit board even if there are other components or wires in the area of the seal. The probe module is then positioned onto the registration module and secured independently with vacuum, which draws a piston upward, carrying the probe pins into contact with the component or circuitry.

The test fixture may be vacuum actuated from two independent vacuum sources, or from a single source using separate supply valves. Additionally, rather than one or more dedicated vacuum pumps, the fixture may be operated from a factory air pressure line using a small pressure-to-vacuum converter.

The test fixture may be made of lightweight materials, such as plastic, and may include, for locating probe pins, a modular universal grid pattern available either in standard component configurations and pin spacings or with a "punch-out" feature to establish a desired probe pattern. Also, blank registration and probe modules may be custom drilled to provide any desired probe pattern.

It is therefore one object of the present invention to provide a miniature vacuum-actuated test fixture for testing individual components or localized circuitry on printed circuit boards.

It is another object of the present invention to provide a vacuum-actuated test fixture which permits precise registration between the pins or leads of a unit under test and probe pins by visual alignment, either through a pattern of holes matching the pins of the unit under test or through a transparent window in the fixture.

It is another object of the present invention to provide a vacuum-actuated test fixture whose size is minimized in order to minimize board warpage due to non-uniformly distributed point loads.

It is a further object of the present invention to provide a vacuum-actuated test fixture having a registration module and a probe module which are separable and which are vacuum actuated independently.

It is still another object of the present invention to provide a vacuum-actuated test fixture which is small, lightweight, and which does not require a large vacuum pump to operate.

It is yet another object of the present invention to provide a vacuum-actuated test fixture which is modular and easily adaptable to any desired probe configuration.

It is still a further object of the present invention to provide a vacuum-actuated test fixture capable of maintaining registration and alignment without being affected to a large degree by thermal expansion, circuit board warp, or tolerance accumulation over a large area.

Other objects, features, and advantages of the present invention will become apparent to those having ordinary skill in the art upon a reading of the following description when taken in conjunction with the accompanying drawings.

DETAILED DESCRIPTION OF THE INVENTION

Figure 1:
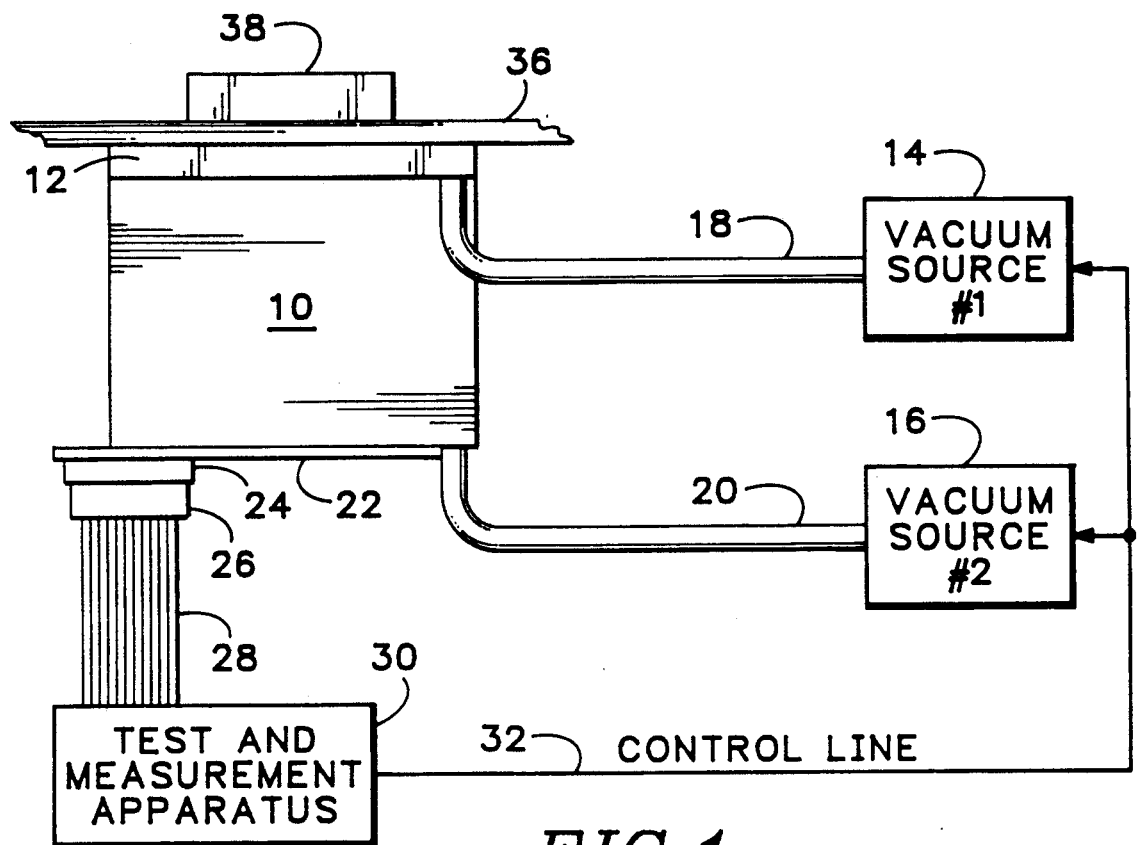
FIG. 1 is a schematic of a test system including a vacuum-actuated test fixture in accordance with the present invention.
Figure 2:
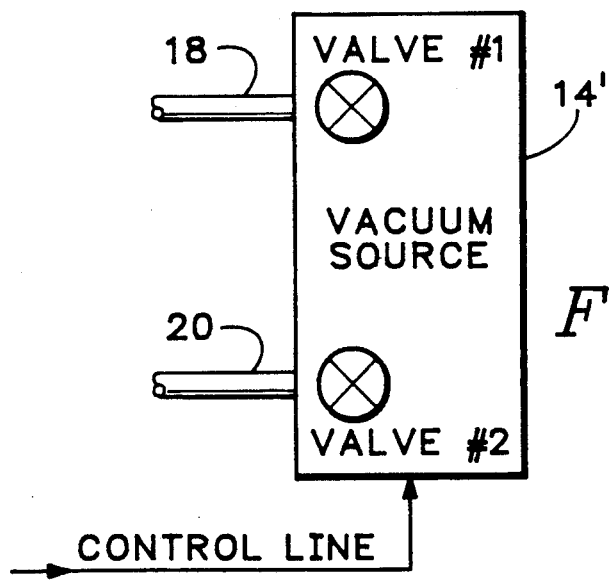
FIG. 2 is a schematic of an alternative vacuum source for the test fixture of FIG. 1.

Referring now to FIG. 1, there is shown in schematic form a vacuum-actuated test fixture in which a probe module 10 and a registration module 12 are in communication with a first vacuum source 14 and a second vacuum source 16 through suitable vacuum-supply hoses or conduits 18 and 20, respectively. An array of probe pins, or simply probes, contained within the probe module 10 are electrically connected to a printed circuit board 22, which in turn is electrically connected via a socket 24, plug 26, and cable 28 to a test and measurement apparatus 30. The vacuum sources 14 and 16 are connected by means of one or more wires represented by control line 32 to test and measurement apparatus 30. It should be understood that depending upon the test fixturing requirements, vacuum sources 14 and 16 could be independent vacuum sources of different pressures, or could be replaced with a single vacuum source 14' having separate valves for connection of the vacuum supply to the probe module 10 and the registration module 12 as shown in FIG. 2.

The test and measurement apparatus 30 would ordinarily be an automatic test system which may be programmed to conduct tests appropriate to a particular unit under test (UUT), represented in FIG. 1 by a printed circuit board 36 having mounted thereon a component 38 to be tested. Component 38 may be any type of device, including surface-mounted integrated circuits, such as microprocessors, programmable logic arrays, or other pin grid array packages. The leads, pins, or test patterns of component 38 appear on the underside of the board 36 and are electrically engaged by the array of probes contained within the probe module 10. A commercially available example of test and measurement apparatus 30 is the 9100A Digital Test System manufactured by John Fluke Mfg. Co., Inc.

Figure 3:
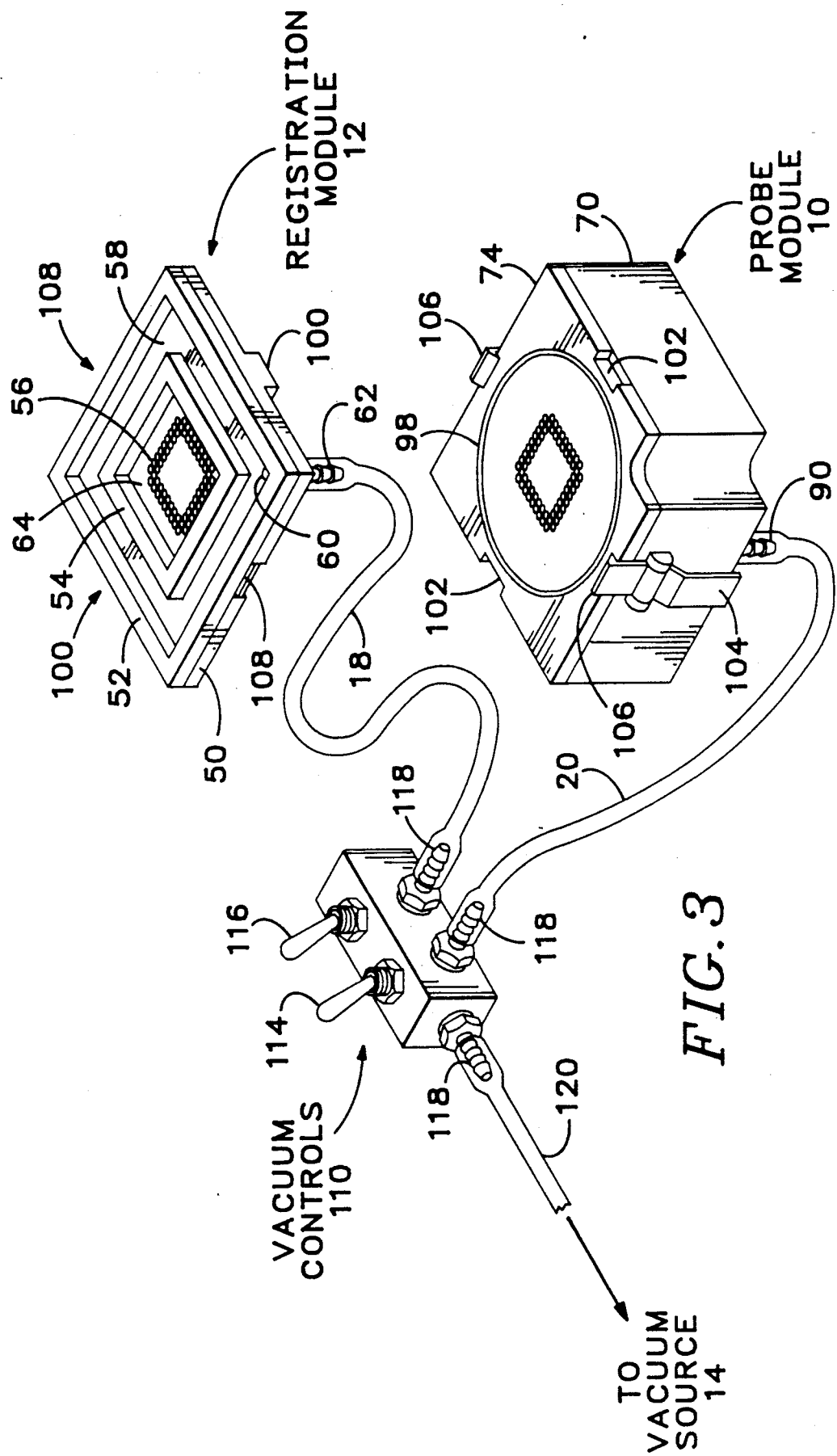
FIG. 3 is a perspective view of the test fixture of present invention with the major components separated to allow detail to be seen.

Referring now to FIG. 3, there is shown a perspective view of a test fixture in accordance with the present invention, with major components separated to allow the detail to be seen. It should be pointed out that the drawings are not to any scale, and the actual physical dimensions of the test fixture depend upon such factors as the size of the component or localized area to be tested and the magnitude of vacuum pressure. Equations to aid in determining physical size in terms of area will be discussed later.

Figure 4:
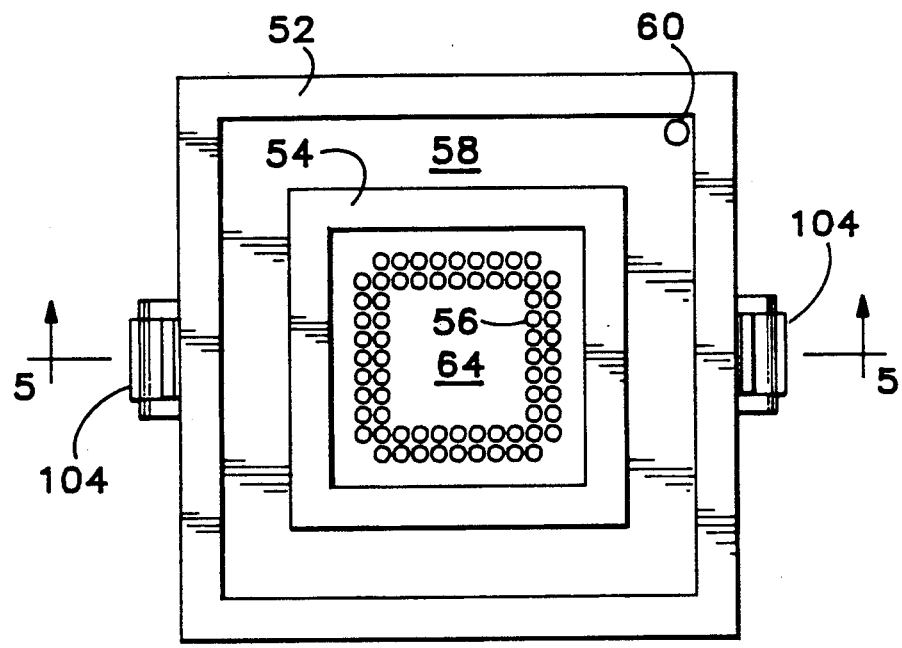
FIG. 4 is a top plan view of the test fixture of the present invention.
Figure 5:
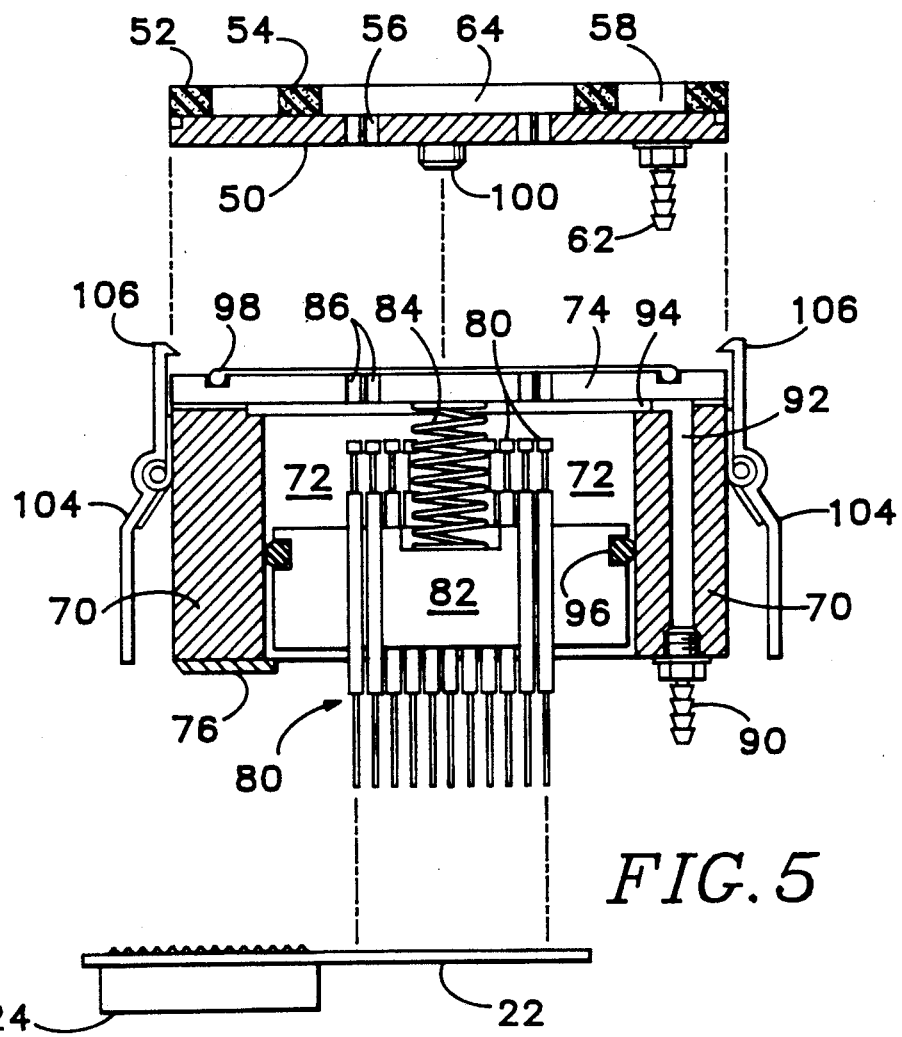
FIG. 5 is side elevation cross-sectional view taken along the lines 5—5 of FIG. 4.

Registration module 12, a top plan view of which is shown in FIG. 4 and a cross-sectional side elevation of which is shown in FIG. 5, is a generally flat plate 50 having an outer compliant seal 52 disposed about the edges of plate 50, and an inner compliant seal 54 disposed around the periphery of a pattern of guide holes 56 through plate 50. The guide holes 56 may be arranged in a "universal" pattern to accommodate a large number of typical pin patterns, or "footprints" of integrated-circuit devices, or the pattern may be arranged as a "personality plate" to accommodate the footprint of a specific device. Registration of the registration module 12 with the UUT (36–38 of FIG. 1) may be accomplished in a number of ways, including, for example, by visually matching the hole pattern 56 with the footprint of the device 38 and applying vacuum to the registration module 12. The plate 50, or at least the inner portion thereof that includes the pattern of holes 56, may be made of a transparent material, such as plexiglas, to provide a clear window to aid in the visual alignment of the registration module 12 with the device 38. The space between the outer and inner compliant seals 52 and 54, when such compliant seals are in contact with the relatively flat surface of a UUT, forms a vacuum chamber 58 for sealing the registration module 12 to the UUT. The material for compliant seals 52 and 54 may suitably be a closed cell urethane foam of soft formulation, or equivalent, so that the seals will form around any components and form an air-tight seal when chamber 58 is evacuated. A vacuum inlet port 60 provides communication through plate 50 to a vacuum supply fitting 62 to which vacuum conduit 18 is attached. A second chamber 64 is formed within in the inner compliant seal 54 and is later evacuated by movement of air through the guide holes 56, as will be discussed below.

The probe module 10 comprises a main body 70 having a cylindrical chamber 72, which is enclosed at the top by a cover plate 74 and has a piston retainer plate 76 at the bottom. An array of spring-loaded contact probes 80 is carried by a piston 82 which moves axially within the chamber 72. A piston key (not shown) attached to the side of piston 82 moves in a longitudinal slot in the cylinder wall and prevents rotation of the piston. A return spring 84 holds piston 82 in its retracted position against the piston retainer place 76 until drawn upward, allowing the spring-loaded contact pins to pass through an array of holes 86 in cover plate 74, by the application of a vacuum source channeled via conduit 20, a vacuum-supply fitting 90 and a vacuum port 92 bored through the wall of main body 70. An annular groove 94 around the upper periphery of chamber 72 ensures unrestricted air flow during piston movement. Piston 82 has a circumferential groove fitted with an O-ring seal 96 to prevent air leakage into the chamber 72 when it is under vacuum. Moreover, cover plate 74 has an annular groove fitted with a gasket or O-ring seal 98 to seal probe module 10 when registration module 12 is in place and vacuum applied.

Registration pins 100 located on opposite sides of registration module 12 mate with slots 102 on opposite sides of probe module 10 to ensure alignment of holes 56 and 86, allowing spring-loaded contact probes 80 to pass through such holes 56 and 86 to electrically engage the circuit nodes on the UUT. A pair of retention catches 104 pivotally secured to opposite sides of main body 70 have latching fingers 106 at the distal ends thereof to engage lips 108 on opposite sides of registration module 12 to grip the registration module 12 and hold it in proper alignment on the probe module 10 until the evacuation forces appear in the probe module 10 part of the test fixture to provide the principal holding power to hold the units together.

Connection of the spring-loaded contact probes to circuit board 22 may be made using any of a number of standard techniques.

As an alternative to the electronically controlled, independent vacuum sources discussed earlier, FIG. 3 shows for simplicity a vacuum control module 110 comprising a body 112 housing a pair of manually-operated vacuum-gating valves 114 and 116, and having vacuum-supply fittings 118 to which vacuum supply conduits 18, 20, and 120 are attached. Vacuum-gating valves 114 and 116 control vacuum flow to the probe module 10 and registration module 12, respectively, and may be operated independently.

A possible test sequence is as follows: Assuming that a vacuum source is applied to vacuum control module 110, and both controls 114 and 116 are in the "off" position, the registration module 12 is visually aligned to the desired orientation over the footprint of a component 38 to be tested. Then control 116 is set to the "on" position, sending the vacuum supply via conduit 18 and vacuum inlet port 60 into chamber 58, compressing the outer and inner compliant seals 52 and 54, respectively, against the circuit board 36. Next, probe module 10 is placed onto registration module 12, aligning registration pins 100 with slots 102 and securing with retention catches 104 to provide mechanical stability. Switch 114 is then placed in the "on" position, sending the vacuum supply via conduit 20 and vacuum inlet port 92 into chamber 72 and into chamber 64 via guide holes 56 and 86, drawing piston 82 upward, carrying spring-loaded contact probes upward through guide holes 86 and 56 to make electrical contact with the pins or leads of component 38 while compressing the return spring 84 against the cover plate 74. The vacuum into chamber 64 aids in holding the test fixture against the circuit board 36, and holds the probe module 10 and registration module 12 together.

Figure 6:
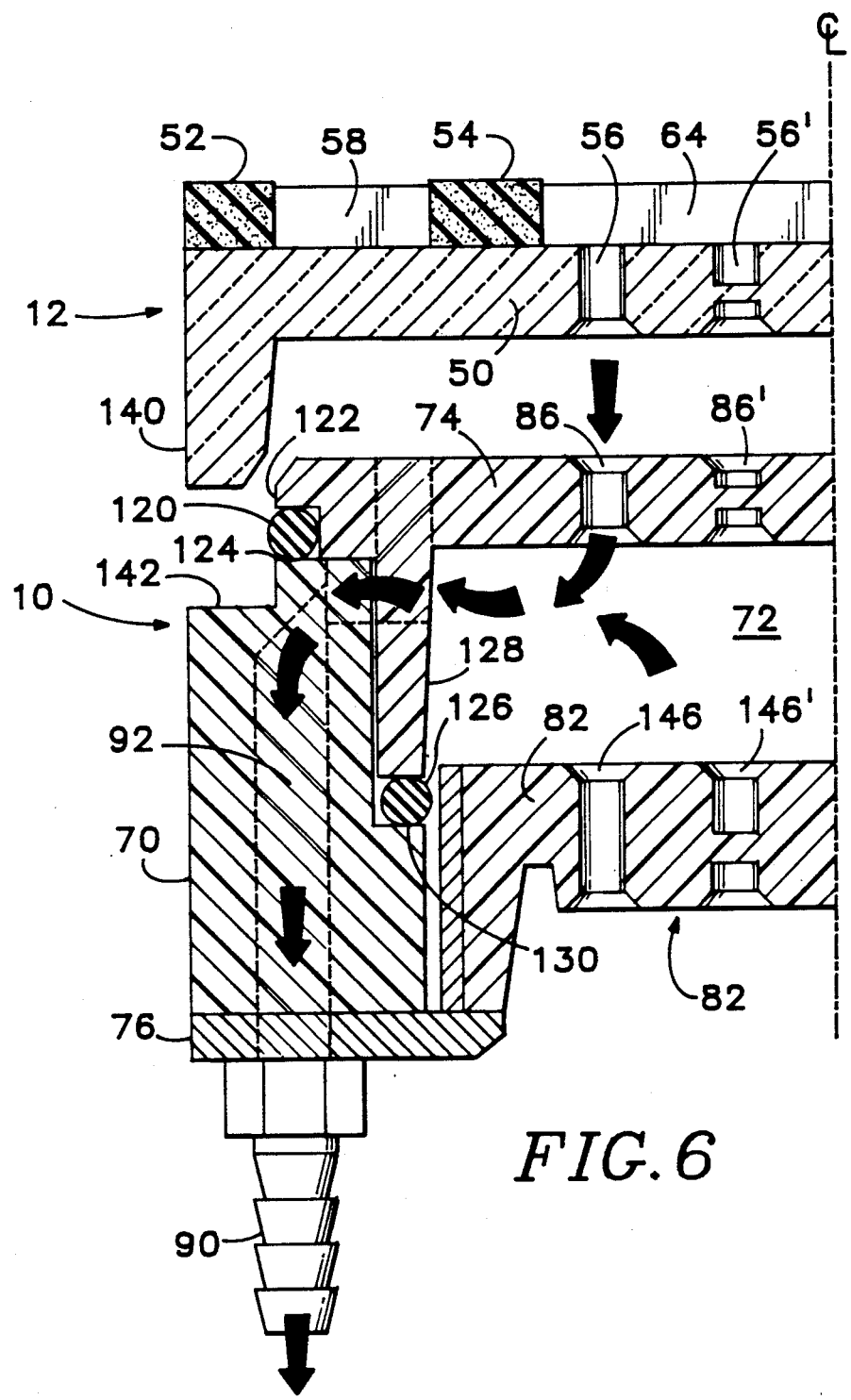
FIG. 6 is a side elevation cross-sectional view of an alternative embodiment of the test fixture in accordance with the present invention.

FIG. 6 shows a cross-sectional view of an alternative embodiment of the present invention, wherein the contact probes and return spring are omitted for clarity. Like components to those described earlier have like reference numerals, and only the differences will be explained. The main body 70 of probe module 10, cover plate 74, and piston 82 are preferably molded of plastic using conventional injection-molding techniques to provide an extremely lightweight yet durable test fixture. A first O-ring seal 120 is captured between a lip 122 and surface 124, and a second O-ring seal 126 is captured between a projection 128 and shoulder 130 as the cover plate 74 and main body 70 are fitted together, providing a double seal to prevent air leakage into chamber 72. Piston 82 has a durable perimeter sleeve 132, preferably of smooth metal such as stainless steel, to facilitate smooth and long-term operation of piston 82 by reducing friction, reducing wear of the plastic parts, and reducing abrasion of O-ring seal 126.

The plate 50 of registration module 12 is preferably molded of transparent plastic, and includes a projection 140 that fits down over cover plate 74 onto shoulder 142 of main body 70, and fits tightly against O-ring seal 120 during operation. As discussed hereinabove, the transparent plastic provides a clear window through visual alignment of the pattern of holes 56 may be made with the pins of the component to be tested. The extremely compliant seals 52 and 54 allow the registration module 12, and hence the test fixture, to be attached to circuit boards even if there are other components in the area of the seal. The nominal height of the seals 52 and 54 in a prototype constructed and tested is approximately three-sixteenths of an inch; however, this provides sufficient clearance for most surface-mount components. Larger seals may be used in situations where component clearance necessitates a greater height, and likewise, smaller seals may be used if component clearance is less of a problem. Air chamber 58 is evacuated as described above to attach registration module 12 to a circuit board. Due to the small size of the test fixture and the airtight seals 120 and 126, the embodiment of FIG. 6 does not require a large vacuum pump to operate. The heavy arrows show the paths of air drawn into inlet port 92 from chamber 72 and through holes 56 and 86 from chamber 64 when a vacuum supply is applied to vacuum supply fitting 90. The vacuum source, rather than being a dedicated vacuum pump, may be a simple small pressure-to-vacuum converter operated on a factory air-pressure line having a nominal pressure of from about 50 to about 100 pounds per square inch (psi). The simple toggle type vacuum switches represented by vacuum control module as shown in FIG. 3 may be used.

Another important feature of the present invention is the modular, "punch-out" universal grid for locating probe pins. Typically, the distance between opposite sides of compliant seal 54, or the diameter thereof if the seal 54 is circular, is about two inches. The universal grid of holes 56 may be available on both 0.100-inch and 0.50-inch centers to match the pin spacings of integrated circuits, and provided in standard component pin patterns or as a kit to create non-standard configurations. This may be accomplished by providing blank registration module plates which may be custom drilled, or which have holes 56' which are partially drilled through and may be punched out using simple tools to provide openings to match the desired component lead configuration. A similar operation is performed on holes 86' to provide openings in cover plate 74, and performed on holes 146' in piston 82. Contact probes 80 are then loaded into holes 146 and secured. Connection to the probe pins may be achieved by any of several conventional techniques, such as standard wire-wrap contacts, soldering, or by a modular plug with an integral termination connector.

As a general rule in determining a minimum size for the test fixture, and in order for the test fixture to work properly, the vacuum exposed area of the printed circuit board assembly must be sufficient to withstand the compression forces of the compliant seals (at rated displacement) and that of the piston/spring-loaded probe assembly. Stated as an equation, the area of the printed circuit assembly is $$A_{PCA} \geq \frac{(A_{SEAL})(P_{SEAL})}{P_{VACUUM}} + A_{PISTON}$$

where A is area in square inches, and P is rated pressure in psi. Likewise, the piston must have an exposed vacuum area sufficient to compress all the spring-loaded probes to their rated displacement. Stated as an equation, the area of the piston is $$A_{PISTON} \geq \frac{\sum_{i=1}^{nodes} F_{PROBES}}{(16\ oz/lb)(P_{VACUUM})}$$

where F is the force of the probes at rated travel in ounces. In both of the above equations, $P_{vacuum}$ is assumed to be substantially the same in both cases, and measured at the vacuum chamber.

While I have shown and described herein the preferred embodiment of my invention, it will be apparent to those skilled in the art that many changes and modifications may be made without departing from my invention in its broader aspects.

What I claim as my invention is:

1. A test fixture for testing localized areas of circuitry including individual components on a circuit board, comprising:
   probe means for making electrical contact with selected points on said circuit board;
   registration means for visually aligning said selected points on said circuit board in precise registration with said probes; and
   vacuum-actuating means for first holding said registration means to said circuit board and thereafter causing said probe means to made contact with said selected points, said vacuum-actuating means comprising means for applying vacuum independently to said registration means and said probe means.

2. A test fixture in accordance with claim 1 wherein said means for applying vacuum comprises a vacuum source coupled to said registration means and said probe means through a pair of independently-controllable valves.

3. A test fixture in accordance with claim 2 wherein said vacuum source is a pressure-to-vacuum converter.

4. A test fixture in accordance with claim 1 wherein said means for applying vacuum comprises a pair of independently-controllable vacuum sources.

5. A test fixture in accordance with claim 1 wherein said probe means comprises a probe body having an evacuable chamber therein and a piston moveable within said chamber, said piston having a predetermined number of probes mounted substantially upright thereon.

6. A test fixture in accordance with claim 1 wherein said registration means is separable from said probe means.

7. A test fixture in accordance with claim 6 wherein said registration means comprises a relatively flat plate having a predetermined pattern of holes to allow said probe means to pass therethrough to contact said selected points on said circuit board, an inner compliant seal disposed around said predetermined pattern of holes, and an outer compliant seal spaced apart from said inner compliant seal to form an evacuable chamber therebetween.

8. A test fixture in accordance with claim 7 wherein at least a portion of said plate is transparent.

9. A test fixture in accordance with claim 7 wherein said predetermined pattern of holes comprises a universal grid that matches predetermined footprints of said individual components.

10. A vacuum-actuated test fixture for testing localized areas of circuitry including individual components on a circuit board, comprising:
    a probe module comprising a probe body containing an array of electrical probes carried by a piston that is movable upon application of a vacuum;
    a registration module that is attachable to said circuit board upon application of a vacuum, said registration module being separable from said probe module and having an array of holes that are visually alignable with selected nodes on said circuit board and that allow said array of probes to pass therethrough to make electrical contact with said selected nodes; and
    vacuum supply means for selectively applying vacuum to said probe module and said registration module.

11. A vacuum-actuated test fixture in accordance with claim 10 wherein said registration module comprises a relatively flat plate having an inner compliant seal disposed around said array of holes and an outer compliant seal spaced apart from said inner compliant seal to form an evacuable chamber therebetween to attach to said circuit board.

12. A vacuum-actuated test fixture in accordance with claim 11 wherein at least a portion of said flat plate is transparent.

13. A vacuum-actuated test fixture in accordance with claim 10 wherein said vacuum supply means comprises a single vacuum source coupled independently to said probe module and said registration module.

* * * * *